(12) United States Patent
Jerominek et al.

(10) Patent No.: US 7,077,969 B2
(45) Date of Patent: Jul. 18, 2006

(54) MINIATURE MICRODEVICE PACKAGE AND PROCESS FOR MAKING THEREOF

(75) Inventors: Hubert Jerominek, Sainte-Foy (CA); Christine Alain, Quebec (CA)

(73) Assignee: Institut National D'Optique, Quebec (CA)

( * ) Notice: Subject to any disclaimer, the term of this patent is extended or adjusted under 35 U.S.C. 154(b) by 259 days.

(21) Appl. No.: 10/304,172

(22) Filed: Nov. 25, 2002

(65) Prior Publication Data

US 2003/0111441 A1    Jun. 19, 2003

Related U.S. Application Data

(62) Division of application No. 09/888,713, filed on Jun. 25, 2001, now Pat. No. 6,686,653.

(60) Provisional application No. 60/214,434, filed on Jun. 28, 2000.

(51) Int. Cl.
*H01B 13/00* (2006.01)

(52) U.S. Cl. .............................. 216/17; 216/18; 216/20

(58) Field of Classification Search .................. 216/13, 216/17, 20; 257/680, 703, 704; 438/107
See application file for complete search history.

(56) References Cited

U.S. PATENT DOCUMENTS

| | | | |
|---|---|---|---|
| 4,701,424 A | 10/1987 | Mikkor | |
| 5,196,919 A | 3/1993 | Miyauchi et al. | |
| 5,397,897 A | 3/1995 | Komatsu et al. | |
| 5,420,419 A | 5/1995 | Wood | |
| 5,459,351 A | 10/1995 | Bender | |
| 5,521,123 A | 5/1996 | Komatsu et al. | |
| 5,528,452 A | 6/1996 | Ko | |
| 5,585,311 A | 12/1996 | Ko | |
| 5,729,019 A | 3/1998 | Krafthefer et al. | |
| 5,766,975 A * | 6/1998 | Templeton et al. | ......... 438/107 |
| 5,895,233 A | 4/1999 | Higashi et al. | |
| 5,914,488 A | 6/1999 | Sone | |
| 6,036,872 A * | 3/2000 | Wood et al. | .................... 216/2 |
| 6,062,461 A | 5/2000 | Sparks et al. | |
| 6,479,320 B1 * | 11/2002 | Gooch | ........................ 438/109 |

FOREIGN PATENT DOCUMENTS

| | | |
|---|---|---|
| EP | 0 851 492 | 7/1998 |
| FR | 2780200 | 12/1999 |
| WO | 98/27411 | 6/1998 |

\* cited by examiner

*Primary Examiner*—Nadine G. Norton
*Assistant Examiner*—Binh X. Tran
(74) *Attorney, Agent, or Firm*—Merchant & Gould P.C.

(57) ABSTRACT

The present invention is concerned with a miniature microdevice package and a process of making thereof. The package has a miniature frame substrate made of a material selected from the group including: ceramic, metal and a combination of ceramic and metal. The miniature frame substrate has a spacer delimiting a hollow. The package also includes a microdevice die having a microdevice substrate, a microdevice integrated on the microdevice substrate, bonding pads integrated on the microdevice substrate, and electrical conductors integrated in the microdevice substrate for electrically connecting the bonding pads with the microdevice. The microdevice die is mounted on the spacer to form a chamber. The microdevice is located within the chamber. The bonding pads are located outside of the chamber.

10 Claims, 11 Drawing Sheets

MINIATURE MICRODEVICE PACKAGE AND PROCESS FOR MAKING THEREOF

This application is a divisional of U.S. patent application Ser. No. 09/888,713 filed Jun. 25, 2001, now U.S. Pat. No. 6,686,653, which application(s) are incorporated herein by reference.

FIELD OF THE INVENTION

The present invention is concerned with a miniature microdevice package and a process of fabricating such a miniature microdevice package. Miniature microdevice packages are made for miniature microdevices such as accelerometers, digital micromirrors, emitters and detectors. Several of these miniature microdevices also require a window transparent to radiation at wavelength of device operation.

BACKGROUND OF THE INVENTION

Various microdevices achieve their maximum performance when operated in vacuum or in controlled gas atmosphere with a predetermined pressure range. Examples of such devices are miniature accelerometers, digital micromirror devices, miniature radiation emitters and thermal detectors such as bolometers, pyro-electric devices and thermopiles. These microdevices are packaged in hermetic vessels called packages. In addition to providing the controlled operational atmosphere, the packages provide a mechanical protection to often very fragile microdevices made by micromachining of silicon, other semiconductor materials as well as glasses. In the case of the microdevices emitting, modulating or detecting electromagnetic radiation of a determined wavelength, the corresponding package has to be equipped with a radiation transparent window. Practically for all devices, the package has also to be equipped with the conducting feedthroughs providing an electrical contact to the microdevice enclosed in the package.

Known in the art is U.S. Pat. No. 5,420,419 by WOOD, which discloses a method of hermetic packaging by making use of a macro vessel with lateral dimensions often exceeding few centimeters. In this method, it is difficult to miniaturize the whole packaged device because the whole device dimensions are determined by the vacuum vessel, no matter how small the microdevice enclosed in the vessel can be made. The whole packaging process is quite intricate and requires expensive parts such as metal vessel equipped with a plurality of leads, a pump-out tube and a relatively large window. The packaging can only be performed one die at a time which reduces the manufacturing throughput and increases the cost.

Also known in the art is U.S. Pat. No. 5,914,488 by SONE. This patent discloses that the window is directly attached to the semiconductor die with a small hermetic cavity between this semiconductor substrate and the window. This concept of micropackaging has been further developed, as described in U.S. Pat. No. 5,895,233 by HIGASHI et al. and U.S. Pat. No. 6,036,872 by WOOD wherein the package is made entirely of two thin silicon wafers which is quite fragile thus providing a limited protection to sometimes extremely fragile microdevice.

Other U.S. patents such as: U.S. Pat. Nos. 4,701,424 (MIKKOR); 5,397,897 (KOMATSU et al.); 5,459,351 (BENDER); 5,521,123 (KOMATSU et al.); 5,528,452 (KO); 5,585,311 (KO); 5,729,019 (KRAFTTHEFER et al.); 6,062,461 (SPARKS et al.) do not provide packages for microdevice that are both robust and cost effective.

SUMMARY OF THE INVENTION

An object of the present invention is to provide a miniature microdevice package that is less fragile than prior art microdevice packages, and is also cost-effective.

According to the present invention, there is provided a miniature microdevice package comprising:
- a miniature frame substrate made of a material selected from the group including: ceramic, metal and a combination of ceramic and metal, the miniature frame substrate having a spacer delimiting a hollow; and
- a microdevice die having a microdevice substrate, a microdevice integrated on the microdevice substrate, bonding pads integrated on the microdevice substrate, and electrical conductors integrated in the microdevice substrate for electrically connecting the bonding pads with the microdevice, the microdevice die being mounted on the spacer to form a chamber, the microdevice being located within the chamber, the bonding pads being located outside of the chamber.

According to the invention, there is also provided a miniature microdevice package comprising:
- a miniature frame substrate made of a material selected from the group including: ceramic, metal and a combination of ceramic and metal, the miniature frame substrate having a spacer delimiting a hollow;
- a microdevice die having a microdevice substrate, a microdevice integrated on the microdevice substrate, bonding pads integrated on the microdevice substrate, and electrical conductors integrated in the microdevice substrate for electrically connecting the bonding pads with the microdevice, the microdevice die being mounted on the spacer to form a chamber, the microdevice being located within the chamber, the bonding pads being located outside of the chamber, the miniature frame substrate being shaped to form a channel for pumping air out of the chamber, the miniature frame substrate being provided with a window for allowing radiation inside the chamber, the window being mounted in a recess provided in the miniature frame substrate; and
- a plug for sealing the channel.

According to the invention, there is also provided a miniature microdevice package comprising:
- a miniature frame substrate made of a material selected from the group including: ceramic, metal and a combination of ceramic and metal, the miniature frame substrate having a spacer delimiting a hollow; and
- a microdevice die having a microdevice substrate, a microdevice integrated on the microdevice substrate, bonding pads integrated on the microdevice substrate, and electrical conductors integrated in the microdevice substrate for electrically connecting the bonding pads with the microdevice, the microdevice die being mounted on the spacer to form a chamber, the microdevice being located within the chamber, the bonding pads being located outside of the chamber, the miniature frame substrate having a recess in which the spacer is located, for receiving the microdevice die, the microdevice substrate being soldered on the spacer;
- electrical contacts being integrated in the miniature frame substrate for providing electric accesses; and
- solderable layers for electrically connecting the bonding pads of the microdevice die to the electrical contacts.

According to another aspect of the present invention, there is provided a process for making a miniature microdevice package, comprising steps of:
- (a) shaping a spacer in a miniature frame substrate made of a material selected from the group including: ceramic, metal and a combination of ceramic and metal;
- (b) providing a microdevice die having a microdevice substrate, a microdevice integrated on the microdevice substrate, bonding pads integrated on the microdevice substrate, and electrical conductors integrated in the microdevice substrate for electrically connecting the bonding pads with the microdevice; and
- (c) mounting the microdevice die on the spacer to form a chamber, the microdevice being located within the chamber, the bonding pads being located outside of the chamber.

According to yet another aspect of the present invention, there is provided a process for making miniature microdevice packages, comprising steps of:
- (a) shaping spacers in a miniature frame substrate made of a material selected from the group including: ceramic, metal and a combination of ceramic and metal;
- (b) providing microdevice dies each having a microdevice substrate, a microdevice integrated on the microdevice substrate, bonding pads integrated on the microdevice substrate, and electrical conductors integrated in the microdevice substrate for electrically connecting the bonding pads with the microdevice;
- (c) mounting the microdevice dies respectively on the spacers to form chambers, the microdevices being respectively located within the chambers, the bonding pads being located outside of the chambers; and
- (d) sawing the miniature frame substrate to obtain the miniature microdevice packages.

According to still another aspect of the present invention, there is provided a process for making miniature microdevice packages, comprising steps of:
- (a) shaping spacers in a miniature frame substrate made of a material selected from the group including: ceramic, metal and a combination of ceramic and metal;
- (b) providing microdevice dies having a common microdevice substrate, each of the microdevice dies having a microdevice integrated on the common microdevice substrate, bonding pads integrated on the common microdevice substrate, and electrical conductors integrated in the common microdevice substrate for electrically connecting the bonding pads with the microdevice;
- (c) mounting the common microdevice substrate with the microdevice dies respectively on the spacers to form chambers, the microdevices being respectively located within the chambers, the bonding pads being located outside of the chambers; and
- (d) sawing the miniature frame and microdevice substrates to obtain the miniature microdevice packages.

BRIEF DESCRIPTION OF THE DRAWINGS

The invention as well as its numerous advantages will be better understood by the following non restrictive description of preferred embodiments made in reference to the appending drawings in which.

DETAILED DESCRIPTION OF THE FIGURES

Figure 1:
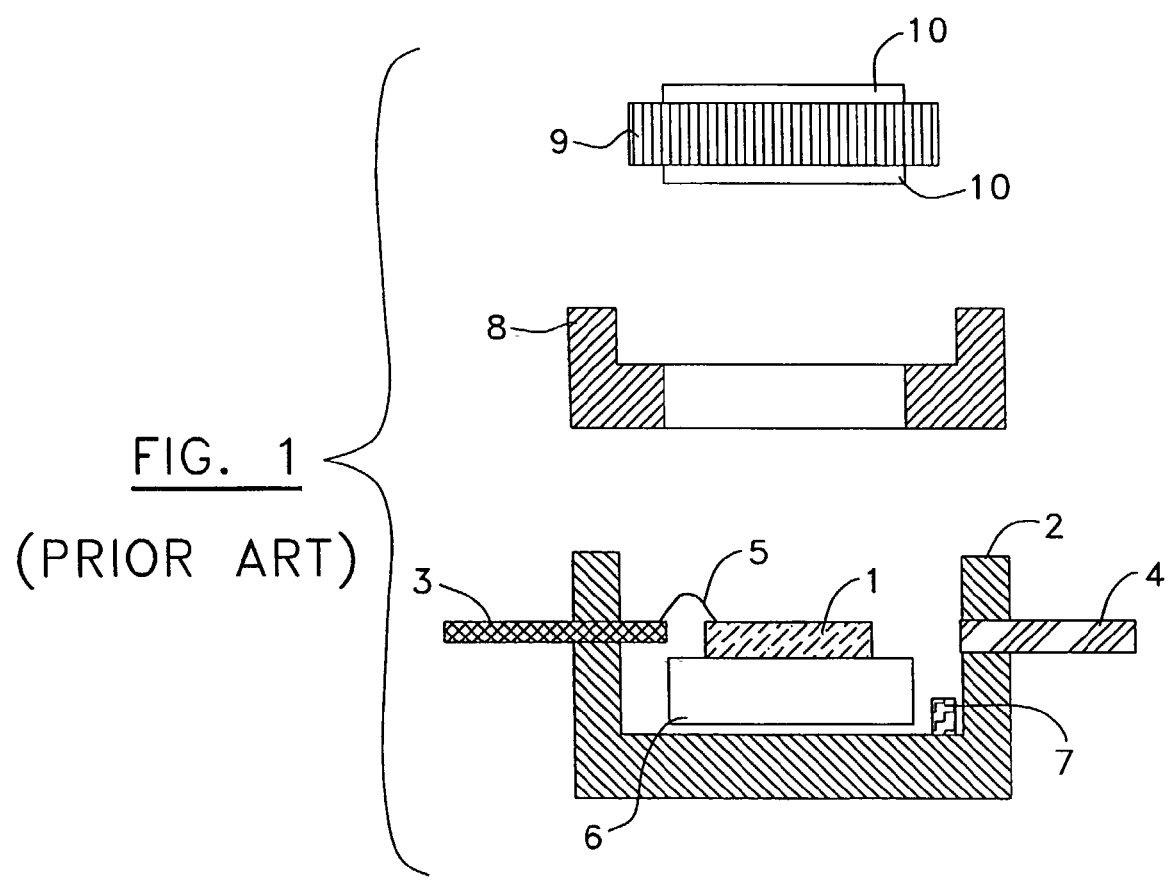
FIG. 1 is an exploded side sectional view of a known standard package.

Referring now to FIG. 1, there is shown an exploded view of a standard vacuum package according to a known macropackaging technique. The packaged microdevice, typically in a form of a microdevice die 1, is placed in an all-metal, ceramic or metal-ceramic vessel 2. This vessel 2 is equipped with conducting metal leads 3 and a pump-out tube 4. The microdevice die 1 is bonded by means of wires 5 to the leads 3 in order to establish an electrical contact with the microdevice die 1. The pump-out tube 4 is used to evacuate the air from the vessel 2. The vessel 2 may also be equipped with a thermoelectric device 6 and a getter 7. The microdevice die 1 is attached to the thermoelectric device 6 that is used for heating, cooling or temperature stabilization of the microdevice die 1. The getter 7 is used to maintain the vacuum conditions in the vessel 2. The vessel 2 has a lid 8 equipped with a window 9. The window 9 has typically both surfaces covered with the antireflection coatings 10. The window 9 is typically soldered to the lid 8 which is soldered or welded to the vessel 2. The window 9 has to be hermetically attached to the lid 8 and the lid 8 has to be hermetically attached to the vessel 2. With the window 9 and lid 8 attached, the vessel 2 is pumped out via a tube 4 and then sealed off by crimping the tube 4. The materials used for attaching the microdevice die 1 to the thermoelectric device 6 and for attaching the thermoelectric device 6 to the vessel 2 have to exhibit a low outgassing rate in order to maintain vacuum inside the sealed package.

This typical method of hermetic packaging, making use of a macro vessel with lateral dimensions often exceeding few centimeters, is described in the U.S. Pat. No. 5,420,419 by WOOD. In this method, it is difficult to miniaturize the whole packaged device because the whole device dimensions are determined by the vacuum vessel, no matter how small the microdevice enclosed in the vessel can be made. The whole packaging process is quite intricate and requires expensive parts such as metal vessel equipped with a plurality of leads and a pump-out tube and a relatively large window. The packaging can only be performed one die at a time which reduces the manufacturing throughput and increases the cost. On the other hand, the devices to be packaged can be pre-tested before the actual packaging takes place, which allows early elimination of defective dies. Both the materials and architecture of the package can be individually tailored to the envisioned application of the microdevice and the environment. Multiple window materials can be chosen for maximum transmittance at the wavelengths of device operation.

Figure 2:
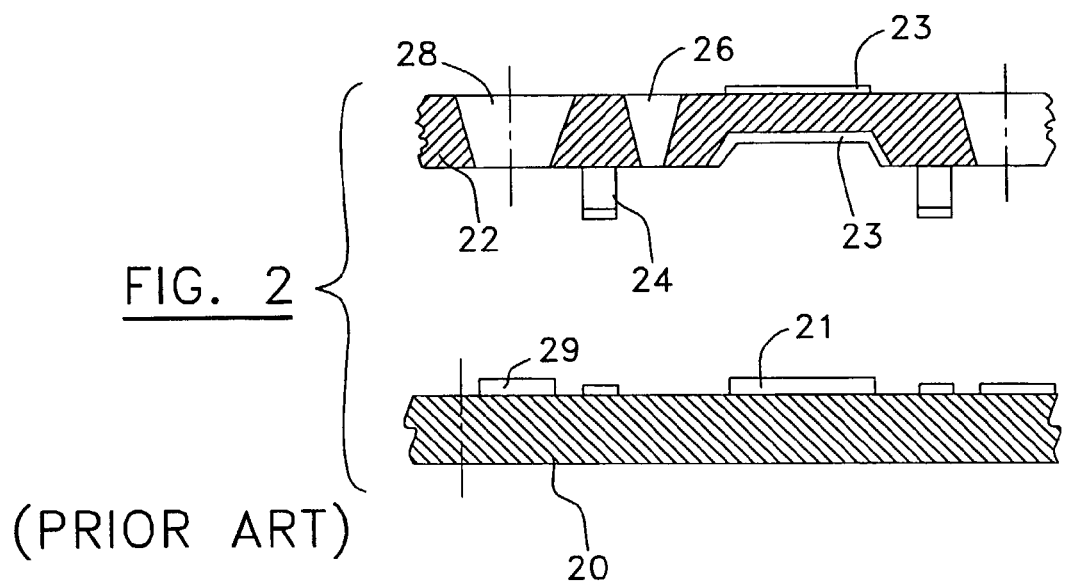
FIG. 2 is an exploded side sectional partial view of another known package.
Figure 3:
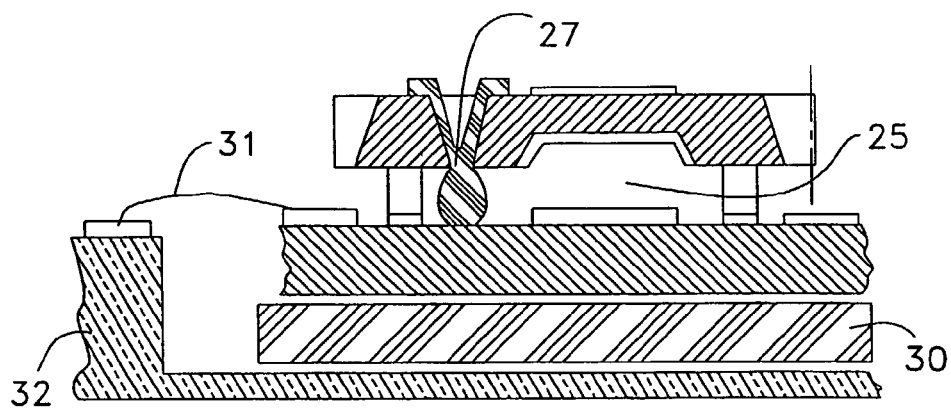
FIG. 3 is a side sectional partial view of another known package.

A different approach to hermetic packaging of microdevices is described in U.S. Pat. No. 5,914,488 by SONE. In this approach the window is directly attached to the semiconductor die with a small hermetic cavity between this semiconductor substrate and the window. This concept of micropackaging has been further developed, as described in U.S. Pat. No. 5,895,233 by HIGASHI et al and U.S. Pat. No. 6,036,872 by WOOD et al. and schematically shown in FIGS. 2 and 3. This concept involves the sealing of two typically silicon wafers: the device wafer 20 equipped with a multitude of individual microdevices 21 and the capping wafer 22 performing a function of the window and covered with the antireflection coatings 23. Due to the existence of a patterned spacer layer 24 between the wafers a multitude of miniature vacuum cavities 25 are formed in the vicinity of microdevices 21. One of the wafers can be equipped with plugable holes 26 for the evacuation of gases from the microcavities 25. After the evacuation, the holes 26 can be hermetically closed with plugs 27. The capping wafer 22 is also equipped with the slots 28 placed over the microdevice bonding pads 29. These slots 28 may provide access to the bonding pads 29 for their wire bonding but most often the slots 28 are used to precisely position the saw blade during wafer cutting into the individually sealed microdevices 21. The individually sealed microdevices 21 are being attached to the thermoelectric devices 30 and wire bonded with wires 31 to the supporting printed circuit board 32.

This packaging method is potentially suitable for low-cost batch fabrication since all the microdevices 21 from the device wafer 20 are packaged at the same time in one packaging step. However, some losses will occur since even the faulty microdevices 21 from the device wafer 20 are also being packaged. The packaged devices can be quite small, almost as small as the microdevices 21 themselves. In practice, the resultant package has only the thickness of two silicon wafers (one standard silicon wafer has a thickness of 500–700 μm). While being truly miniature, this package made entirely of two thin silicon wafers is also quite fragile thus providing a limited protection to sometimes extremely fragile microdevice. In the described approach, the capping silicon wafer functions as a window to the electromagnetic radiation either emitted or detected by the microdevice. Ordinary silicon is not transparent to the visible light and has a limited transmittance in the far infrared part of the spectrum. This severely limits applications of the described micropackaging scheme. High cost of the antireflection coatings to be placed on the silicon window also reduces cost savings related to application of this silicon window.

Cutting of the bonded wafers into individually packaged devices has to be very precise to prevent damage to the device bonding pads which can be as small as 50×50 μm². In order to be able to operate the individually packaged microdevices, one has to establish an electrical contact between the external electronics usually mounted on a printed circuit board and these microdevices. This is done by wire bonding with wires as thin as 5 to 25 μm of the individual bonding pads of the microdevice with the corresponding pads of the printed circuit board. If unprotected by proper shielding, these very fragile wire bonds can easily be damaged. Thus an utilization of an additional macropackage may still be required.

In this invention, a novel scheme and method for miniature hermetic packaging of microdevices is proposed. In general terms, this novel packaging scheme is based on the utilization of a miniature ceramic or metal frame performing functions of a support, mechanical and environmental as well as electrical shield for a microdevice die which, together with the frame, constitute the walls of a miniature vacuum vessel. If required, a third component namely a window hermetically attached to the frame and positioned over the active surface of the microdevice, may be part of this vacuum vessel. The miniature package frame is typically made of a monolithic or a multilayer ceramic material and its geometrical form is realized using the techniques of mechanical machining, pressing and sintering, punching and plasma etching. These techniques allow enormous flexibility in terms of the ceramic frame form. This form can be adapted in the best possible way to the physical requirements of a particular package. Electrical contacts created in the microdevice die and/or in the frame provide an electrical connection to the microdevice. A preferred method for a hermetic attachment of all the miniature vessel parts is soldering. The soldering technique offers reliable hermetic joints formed at relatively low temperatures.

Moreover, this technique also offers a high-precision self-alignment of the joined part caused by the surface tension forces of the molten solder during its thermal reflow. The miniature hermetic package proposed has dimensions comparable to the dimensions of the microdevice itself.

Figure 4:
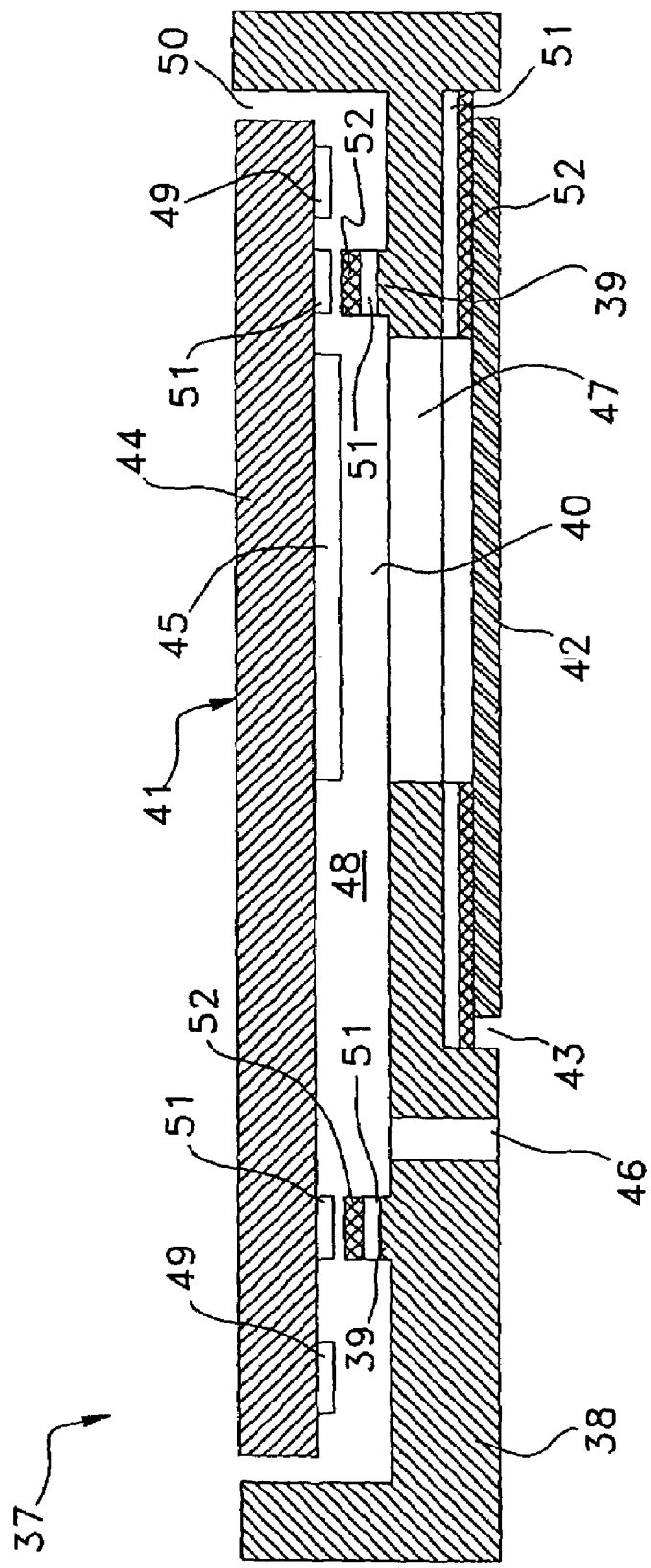
FIG. 4 is an exploded side sectional view of elements needed in a process for making a miniature microdevice package, according to a preferred embodiment of the present invention.

Referring to FIG. 4, there is shown an individual miniature microdevice package 37 according to a preferred embodiment of the present invention. The package 37 includes a miniature frame substrate 38 made of a material selected from the group including: ceramic, metal and a combination of ceramic and metal. The miniature frame substrate 38 has a spacer 39 delimiting a hollow 40. The package 37 also includes a microdevice die 41 having a microdevice substrate 44, a microdevice 45 integrated on the microdevice substrate 44, bonding pads 49 integrated on the microdevice substrate 44, and electrical conductors (not shown) integrated in the microdevice substrate 44 for electrically connecting the bonding pads 49 with the microdevice 45. The microdevice die 41 is mounted on the spacer 39 to form a chamber 48. The microdevice 45 is located within the chamber 48. The bonding pads 49 are located outside of the chamber 48.

Preferably, the miniature frame substrate 38 is shaped to form a channel 46 for pumping air out of the chamber 48. The package 37 further has a plug (not shown) for sealing the channel 46. Alternatively, the package can be prepared in a vacuum and then hermetically sealed, which would render unnecessary the channel 46 for pumping out air and its respective plug.

Preferably, the miniature frame substrate 38 may have a recess 50 in which the spacer 39 is located, for receiving the microdevice die 41. The miniature frame substrate 38 may also be provided with a window 42 for allowing radiation inside the chamber 48. Preferably, the miniature frame substrate 38 is shaped to form an opening 47 which is aligned with the window 42. The window 42 is mounted in a recess 43 provided in the miniature frame substrate 38. The window 42 is shown bonded to the miniature frame substrate 38 with bonding pad 51, and solder alloy layer 52. The window 42 is typically made of glass, Si, Ge, ZnS and ZnSe.

The microdevice substrate 44 is preferably soldered on the spacer 39 of the miniature frame substrate 38. The soldering hermetically seals the chamber 48. The spacer 39 preferably forms a ring circumscribing the active part of the microdevice 45.

Alternatively, the microdevice substrate 44 can be glued onto the spacer 39 of the miniature frame substrate 38. The glue must have low outgassing rate and proper mechanical and thermal properties. In other words, the glue must feature low porosity, mechanical strength and a wide range of operating temperatures.

Because solder alloys cannot wet or bond to semiconductor materials such as silicon and ceramics, solder bonding of these materials requires, for example, solderable bonding pads 51 adhered to the surfaces to which the solder will metallurgically bond. These solderable bonding pads 51 typically contain three layers: an adhesion layer, a diffusion barrier layer and a solderable layer. The adhesion layer provides adhesion to the material of the miniature frame substrate 38 and the material of the microdevice die 41. Suitable materials for the adhesion layer include Ti, TiW, NiV, Cr and Al. The diffusion barrier layer is generally formed of a material such as Ni, NiV, CuCr, Pt or Pd which exhibit very slow intermetallic formation rates to prevent solder dewetting. The solderable layer preferably reacts quickly with the solder alloy layer 52 to form a metallurgical bond during solder reflow. Suitable materials for the solderable layer include Au, Ag, Cu, Ni, NiV, Pt. In order to preserve the solderability of the solderable layer, a thin layer of an oxidation barrier such as Au, Ag or Pt, can be deposited on this solderable layer. Suitable processes for depositing of all the three layers of the solderable bonding pads 51 include screen printing, plating such as electroplating and electroless plating, sputtering, evaporation and combinations of these techniques.

The solder alloy layers 52 typically are made of the alloys including PbSn, AgSn, AuSn, InSn, SbSn and other solder alloys know in the art. These solder alloy layers 52 can be plated, evaporated, sputtered or screen printed. These solder alloys typically flow at temperatures below 350° C. which eliminates thermal damage to the microdevices but still allows to obtain a reliable hermetic seal.

The miniature frame substrate 38 is typically made of a ceramic material but a metallic material may be also used. The requirements for the ceramic material include the following properties: machinable, high dielectric strength, low-thermal conductivity, high-use temperatures, chemical resistance, no outgasing, low porosity, strength and dimensional stability, radiation resistance, coefficient of thermal expansion matched to the microdevice die material and properties enabling metalization and soldering. For example, the potential ceramic materials of interest include: $Al_2O_3$, AlN, BeO, SiC and BN as well as mixed-oxide materials such as Macor™ ($SiO_2/Al_2O_3/MgO/K_2O/B_2O_3$).

As stated above, the plugable pump-out channel 46 is used to evacuate the chamber 48 and opening 47 after completion of the operations of hermetic soldering of the window 42 and the microdevice die 41. This allows performing the soldering operations in the air atmosphere. The chamber 48 and opening 47 are then subjected to outgassing by heat treatment combined with vacuum pumping. After completion of this outgassing process, the plugable channel 46 is closed. It is also possible to eliminate the plugable channel 46 all together and to perform the soldering of either the window 42 or the microdevice die 41 in vacuum.

Referring back to FIG. 4, the process for making the microdevice package 37 essentially includes the following steps:

(a) shaping a spacer 39 in a miniature frame substrate 38 made of a material selected from the group including: ceramic, metal and a combination of ceramic and metal;

(b) providing a microdevice die 41 having a microdevice substrate 44, a microdevice 45 integrated on the microdevice substrate 44, bonding pads 49 integrated on the microdevice substrate and electrical conductors integrated in the microdevice substrate 44 for electrically connecting the bonding pads 49 with the microdevice 45; and (c) mounting the microdevice die 41 on the spacer 39 to form a chamber 48, the microdevice 45 being located within the chamber 48, the bonding pads 49 being located outside of the chamber 48.

Preferably, the process also comprises the following steps:

(d) shaping the miniature frame substrate 38 to form a channel 46 for pumping air out of the chamber 48;

(e) pumping air out of the chamber 48 through the channel 46 to produce a vacuum within the chamber 48; and (f) after step (e), hermetically sealing the channel 46.

In the above process, the shaping of step (d) may preferably be performed during step (a), and the shaping of step (a) may further comprise a step of shaping a recess 50 in the miniature frame substrate 38 for receiving the microdevice die 41.

Preferably, the shaping of step (a) may further comprise a step of shaping an opening 47 for the chamber 48 through the miniature frame substrate 38, and before step (e), a step of soldering the window 42 on the miniature frame substrate 38 for blocking the opening 47 and allowing radiation inside the chamber.

Preferably, the shaping of step (a) may further comprise a step of shaping the recess 43 in the miniature frame substrate 38 for receiving the window 42, and step (c) may be performed by soldering or gluing the microdevice substrate 38 on the spacer 39.

Figure 5:
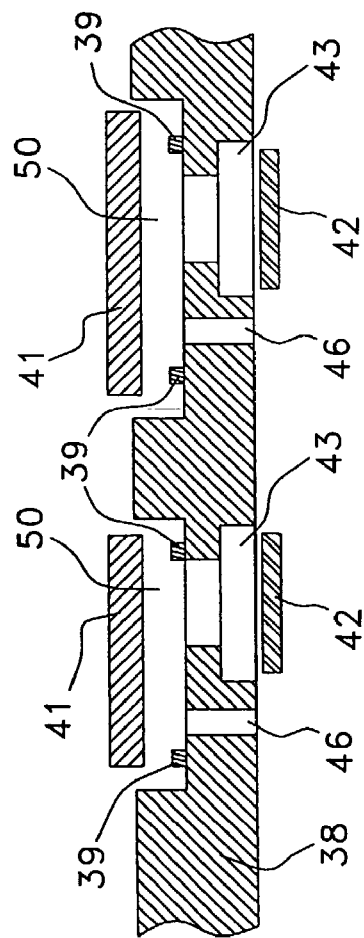
FIG. 5 is an exploded side sectional partial view of elements needed in a first step of another process for making miniature microdevice packages, according to a preferred embodiment of the present invention.
Figure 6:
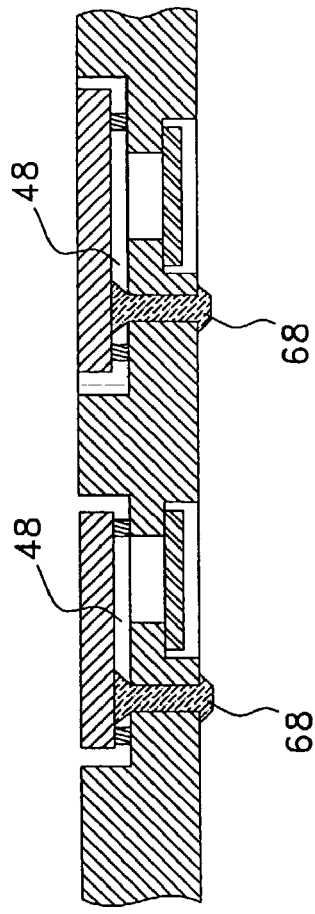
FIG. 6 is a partial side sectional view of the elements of FIG. 5 in a second step of the process started in FIG. 5.
Figure 7:
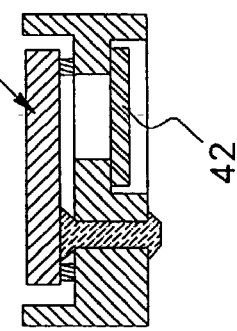
FIG. 7 is a side sectional view of a miniature microdevice package obtained by the process shown in FIGS. 5 and 6.

FIGS. 5, 6 and 7 show the steps of another process for making miniature microdevice packages according to a preferred embodiment of the present invention. In this case a ceramic or metallic miniature frame substrate 38, equipped with a multitude of recesses 43 and 50, is used as a tray supporting a multitude of microdevice dies 41 and windows 42. Each window 42 is individually selected for an optimal operation of each corresponding microdevice die 41. The ceramic miniature frame substrate 38 used as tray may also be equipped with a multitude of pump-out plugable channels 46 and spacers 39 such as ridges. The packaging process consists of hermetic soldering the windows 42 in the recesses 43, hermetic soldering of the microdevice dies 41 in the recesses 50, pumping out and degassing of miniature chambers 48 and then closing the pump-out channels 46 with plugs 68. Plugs 68 can be made typically of an evaporated metal such as Pb or its alloys. In the next step, the ceramic miniature frame substrate 38 is sawed into individual vacuum vessels each now becoming an individual miniature microdevice package 37, which is made of individual pieces of the ceramic miniature frame substrate 38, the individual microdevice dies 41 and the individual windows 42, all hermetically soldered together.

Referring back to FIGS. 5, 6 and 7, the process for making miniature microdevice packages 37, essentially comprises the steps of:

(a) shaping spacers 39 in a miniature frame substrate 38 made of a material selected from the group including: ceramic, metal and a combination of ceramic and metal;

(b) providing microdevice dies 41 each having a microdevice substrate, a microdevice integrated on the microdevice substrate, bonding pads integrated on the microdevice substrate, and electrical conductors integrated in the microdevice substrate for electrically connecting the bonding pads with the microdevice;

(c) mounting the microdevice dies 41 respectively on the spacers 39 to form chambers 48, the microdevices being respectively located within the chambers 48, the bonding pads being located outside of the chambers; and (d) sawing the miniature frame substrate 38 to obtain the miniature microdevice packages 37 such as the one shown in FIG. 7.

Preferably, the above process also comprises the following steps:

(e) shaping the miniature frame substrate 38 to form channels 46 for pumping air out of the chambers 48;

(f) pumping air out of the chambers 48 through the channels 46 to produce a vacuum within the chambers 48; and (g) after step (f), hermetically sealing the channels 46.

Figure 8:
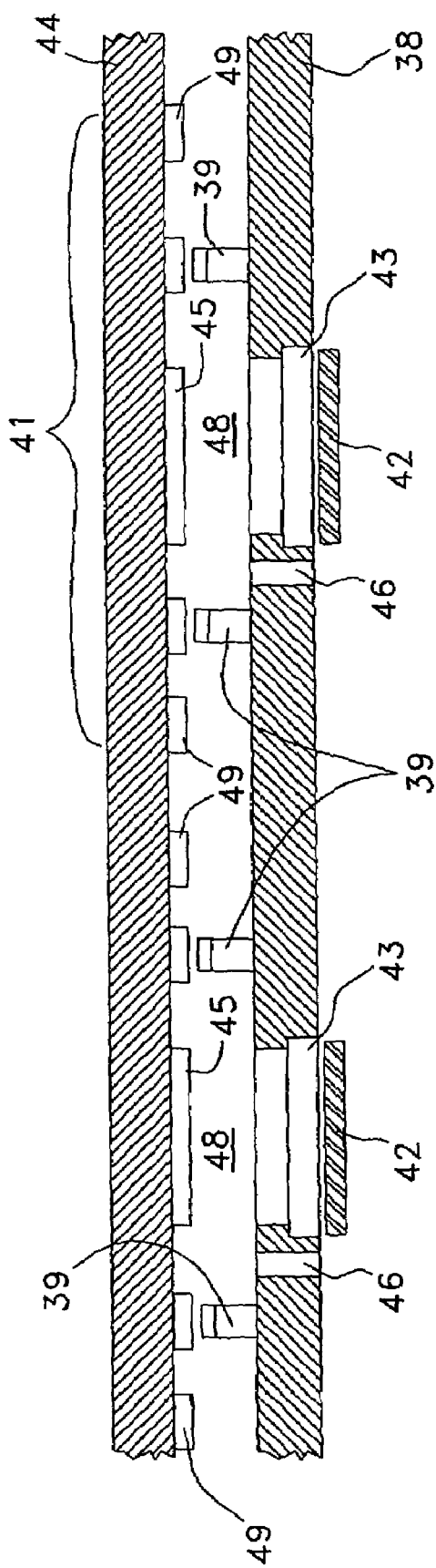
FIG. 8 is an exploded side sectional partial view of elements needed in yet another process for making miniature microdevice packages, according to a preferred embodiment of the present invention.

In a third preferred embodiment schematically shown in FIG. 8, two substrates 44 and 38 are brought together: a microdevice substrate 44 with a multitude of microdevice dies 41 and a ceramic or metallic miniature frame substrate 38 equipped with recesses 43, plugable pump-out channels 46 and spacers 39. The packaging process consists of soldering individual windows 42, which are selected for optimal operation of microdevices 45, in the recesses 43; soldering both substrates 44 and 38 together making use of the soldering material deposited on the spacer 39, such as ridges; pumping-out and outgassing of all individual chambers 48 via the pumpout plugable channels 46; and finally hermetic plugging of all pump-out channels 46. At the end, the bonded substrates 44 and 38 are sawed into individual vacuum vessels each now becoming an individual miniature microdevice package 37, which is made of the individual pieces of the ceramic miniature frame substrate 38, the individual pieces of the microdevice substrate 44 and the individual windows 42.

Referring back to FIG. 8, the process for making miniature microdevice packages, essentially comprises the steps of:

(a) shaping spacers 39 in a miniature frame substrate 38 made of a material selected from the group including: ceramic, metal and a combination of ceramic and metal;

(b) providing microdevice dies 41 having a common microdevice substrate 44, each of the microdevice dies 41 having a microdevice 45 integrated on the common microdevice substrate 44, bonding pads 49 integrated on the common microdevice substrate 44, and electrical conductors integrated in the common microdevice substrate 44 for electrically connecting the bonding pads 49 with the microdevice 45;

(c) mounting the common microdevice substrate 44 with the microdevice dies 41 respectively on the spacers 39 to form chambers 48, the microdevices 45 being respectively located within the chambers 48, the bonding pads 49 being located outside of the chambers 48; and (d) sawing the miniature frame substrate 38 and microdevice substrate 44 to obtain the miniature microdevice packages 37.

In the all-preferred embodiments of the proposed packaging scheme, the created vacuum chamber 48 may be equipped with an appropriate quantity of a getter material to maintain the vacuum conditions.

Figure 9:
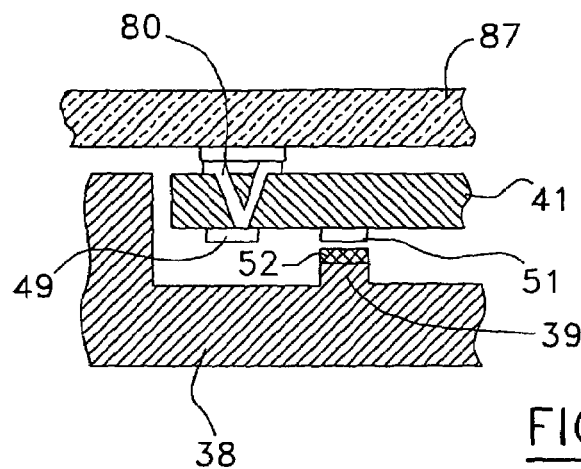
FIG. 9 is an exploded side sectional partial view of a miniature microdevice package connected to a printed circuit board, according to a preferred embodiment of the present invention.

Referring to FIG. 9, a preferred embodiment for establishing of electrical contact paths to the packaged microdevices is illustrated, wherein the microdevice die 41 may also preferably have through-hole connectors 80 for providing electric accesses to the bonding pads 49. Thereby, the through-holes connectors 80 are in electrically conductive contact with the bonding pads 49 of the microdevice die 41. Here too, similarly as it was explained above, the microdevice die 41 is soldered to the ceramic miniature frame substrate 38 by making use of the solder alloy layer 52 deposited on the spacer 39 and the bonding pads 51 produced on the surface of the microdevice die 41.

After completion of the packaging process, the packaged microdevice die 41 can be attached to, for example, a printed circuit board (PCB) 87 via soldering of the conductive through-holes connectors 80. In addition to mechanical attachment, this allows establishing a direct electrical contact between the PCB 87 and the microdevice die 41 via these conductive through-holes connectors 80. This procedure allows eliminating a delicate process of wire bonding of the bonding pads 49 of the microdevice die 41 to the contact pads of the PCB 87.

Figure 10:
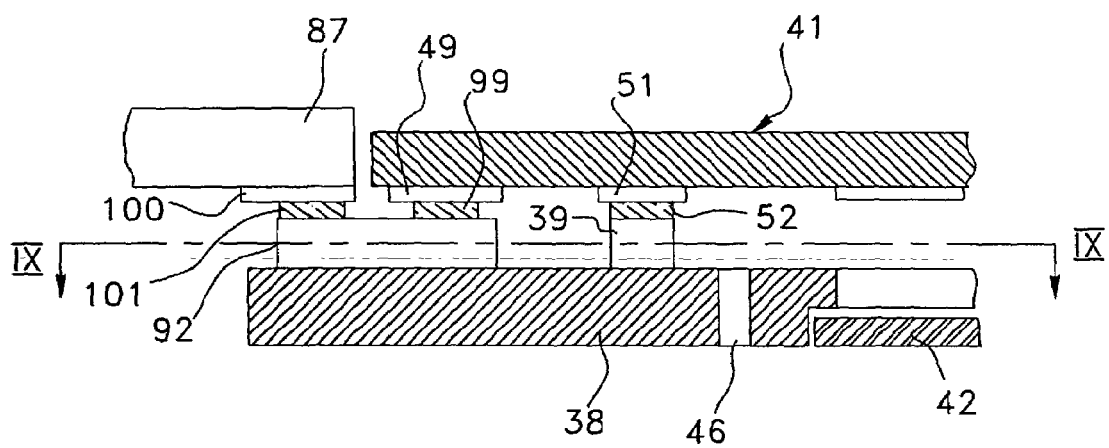
FIG. 10 is a partial side sectional view of another miniature microdevice package connected to a printed circuit board, according to a preferred embodiment of the present invention.
Figure 11:
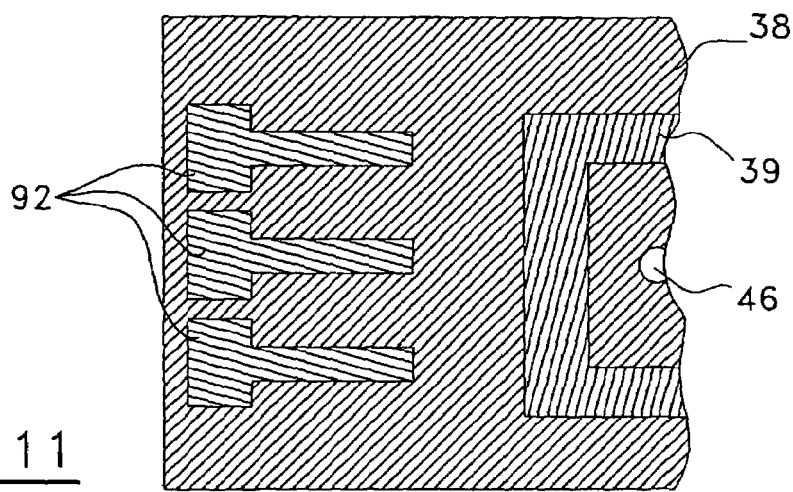
FIG. 11 is a top sectional view along line XI—XI of FIG. 10.

Referring to FIGS. 10 and 11, there is shown a different manner of establishing an electrical connection between the microdevice die 41 and the PCB 87. As shown, electrical contacts 92 may be integrated in the miniature frame substrate 38 for providing electric accesses to the microdevice die 41. Solder alloy layers 99 are also provided for electrically connecting the bonding pads 49 of the microdevice die 41 to the electrical contacts 92. As described above, there is also shown a ceramic miniature frame substrate 38 hermetically soldered to the microdevice die 41. The window 42 hermetically soldered to the ceramic miniature frame substrate 38 and the pump-out channel 46 made in the ceramic miniature frame substrate 38 are also visible. The microdevice die 41 is soldered to the ceramic miniature frame substrate 38 making use of the solder material 52 deposited on the spacer 39. In the same soldering operation, the bonding pads 49 of the microdevice die 41 are soldered to the electrical contacts 92 of the ceramic miniature frame substrate 38 making use of the solder alloy layer 99. This allows establishing an electrical contact between the microdevice die 41 and the electrical contacts 92 of the ceramic miniature frame substrate 38. The electrical contacts 92 and the spacer 39, both on of the ceramic miniature frame substrate 38, can be simultaneously produced for example by a selective plating method. The soldering of the bonding pads 49 of the microdevice die 41 to the electrical contacts 92 of the miniature frame substrate 38 can be performed simultaneously in one soldering step. The microdevice die 41 can then be attached to the PCB 87 by soldering of the electrical contacts 92 of the ceramic miniature frame substrate 38 to electrical contacts 100 of the PCB 87 making use of the solderable layer 101. This in turn allows establishing an electrical connection between the PCB 87 and the microdevice die 41 via the electrical contacts 92 of the ceramic miniature frame substrate 38 and via the bonding pads 49 of the microdevice die 41.

Figure 12:
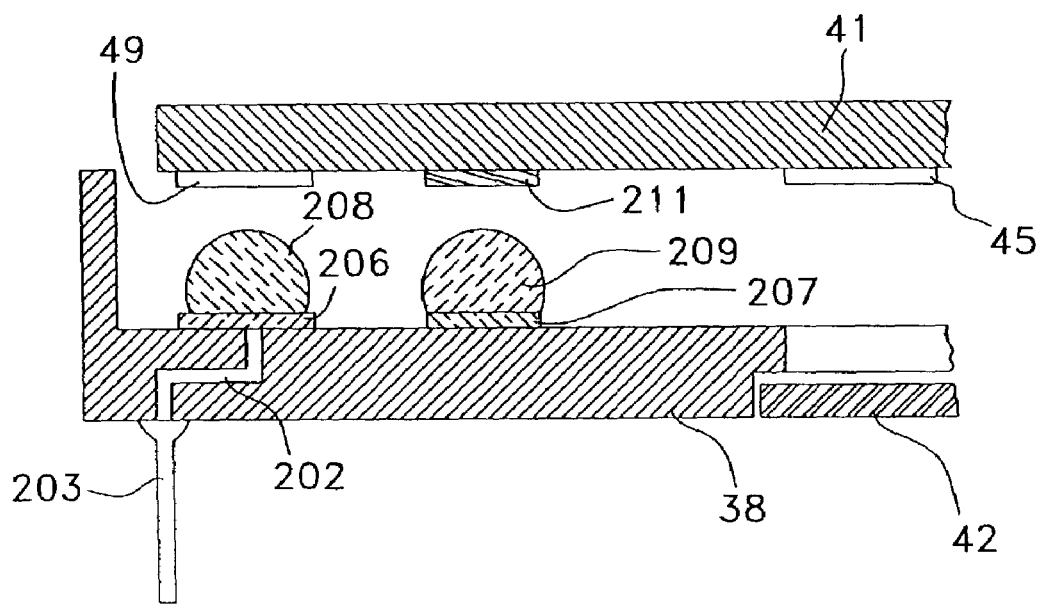
FIG. 12 is a partial, exploded side sectional view of a miniature microdevice package according to a preferred embodiment of the present invention.
Figure 13:
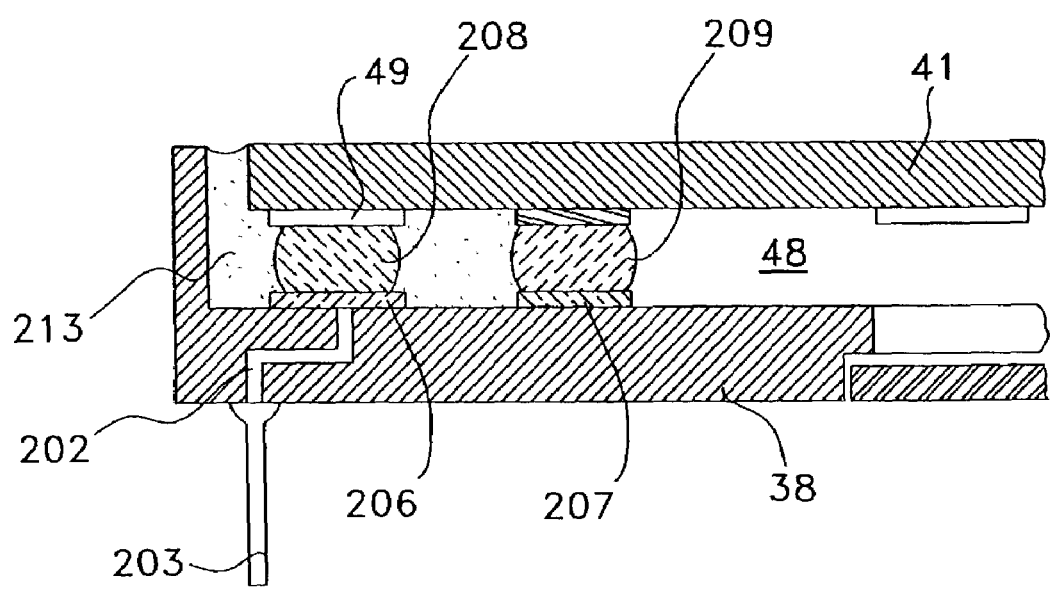
FIG. 13 is a partial side sectional view of the miniature microdevice package shown in FIG. 12 as assembled.

Referring to FIGS. 12 and 13, there is shown yet another different manner of establishing an electrical connection between the microdevice die 41 and a PCB. The electrical connection to the microdevice die 41 is established by making use of a multilayer ceramic miniature frame substrate 38 incorporating internal metal lines 202 and metal pins 203. The ceramic miniature frame substrate 38 is also equipped with a hermetically soldered window 42 to be positioned in front of-the microdevice 45 of the microdevice die 41, metal pads 206 connected electrically to the metal lines 202, spacer ridge metal pads 207, reflown solder bumps 208 placed on the metal pads 206, reflown solder bumps 209 placed on spacer ridge metal pads 207. The microdevice die 41 is equipped with electrically conductive bonding pads 49 and soldering pads 211. In a single flip-chip soldering operation, the microdevice die 41 is mechanically attached to the ceramic miniature frame substrate 38 using the solder bumps 209 and the electrical contact paths from the pins 203, through the, metal lines 202, metal pads 206 and solder material 208 are established to the bonding pads 49 of the microdevice die 41. The space between the bonded parts 41 and 38 outside the chamber 48 can be filled with the underfill material 213. The underfill material 213, typically an epoxy resin, protects the solder joints from external contamination and distributes the mechanical stress away from the solder bumps 208 and 209, thus increasing the reliability of the solder joints. The conductive pins 203 of the ceramic miniature frame substrate 38 can be placed in the corresponding sockets of a PCB thus establishing electrical contact between this PCB and the packaged microdevice die 41.

Referring now to FIGS. 14, 15 and 16, there is schematically shown an assembly process for making the miniature hermetic packaging 37 shown in FIG. 4.

Figure 14A:
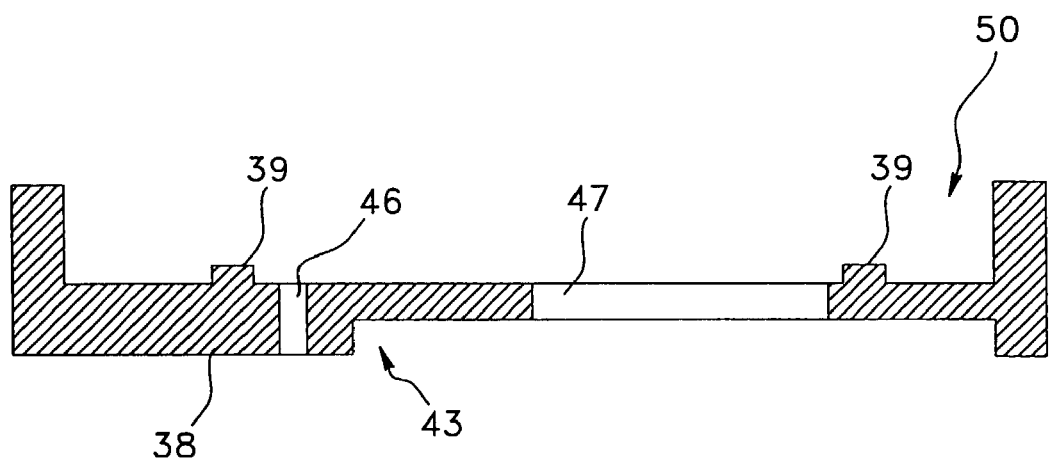
FIGS. 14A to 14F, 15A, 15B, and 16A to 16C are side sectional views of package elements needed in sequential steps of a process for making a miniature microdevice package, according to a preferred embodiment of the present invention.

Referring now to FIG. 14A, there is shown the ceramic or metal miniature frame substrate 38. This ceramic miniature frame substrate 38 is equipped with a recess 43, a spacer 39, a recess 50, an opening 47 between the recesses 43 and 50, and a pump-out channel 46. The ceramic miniature frame substrate 38 with its recesses 43 and 50, the spacer 39, the opening 47 and the channel 46, is made by techniques of mechanical machining, pressing and sintering, punching or plasma etching.

Figure 14B:
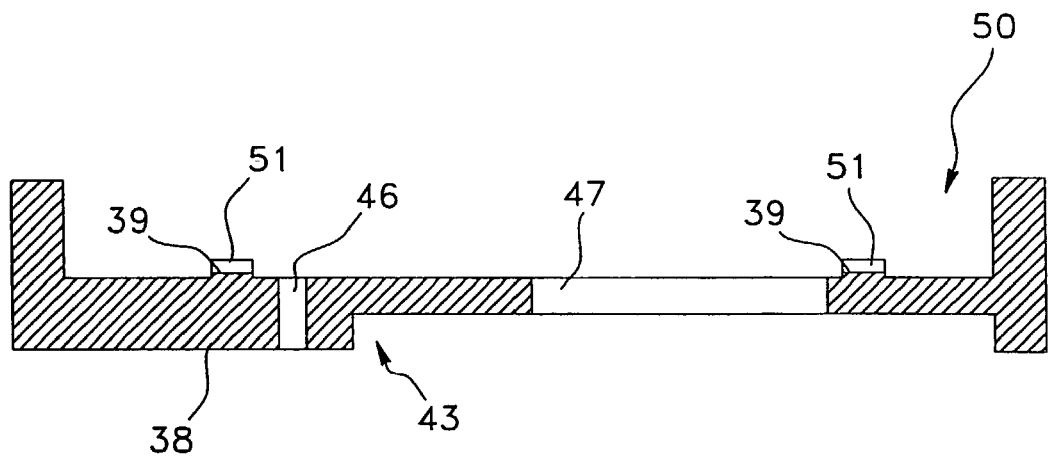

FIG. 14B shows deposition and patterning of metallic solderable bonding pads 51 on the spacer 39 of the miniature frame substrate 38. The bonding pads 51 are produced by techniques of screen-printing, plating, sputtering, evaporation or combinations of these techniques. The solderable bonding pads 51 will serve for soldering of the microdevice die (not shown) to the ceramic miniature frame substrate 38.

Figure 14C:
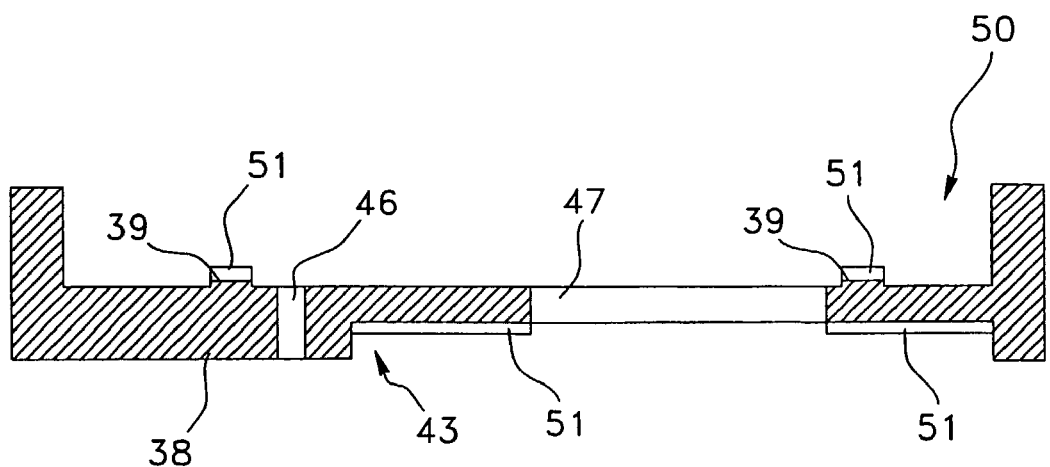

FIG. 14C shows deposition and patterning of metallic solderable bond pads 51 placed in the recess 43 of the miniature frame substrate 38. These bonding pads 51 are produced by the same techniques as the techniques used for manufacturing of the bonding pads 51 mounted on the spacer 39. The bonding pads 51 will serve for soldering of the package window (not shown) to the miniature frame substrate 38.

Figure 14D:
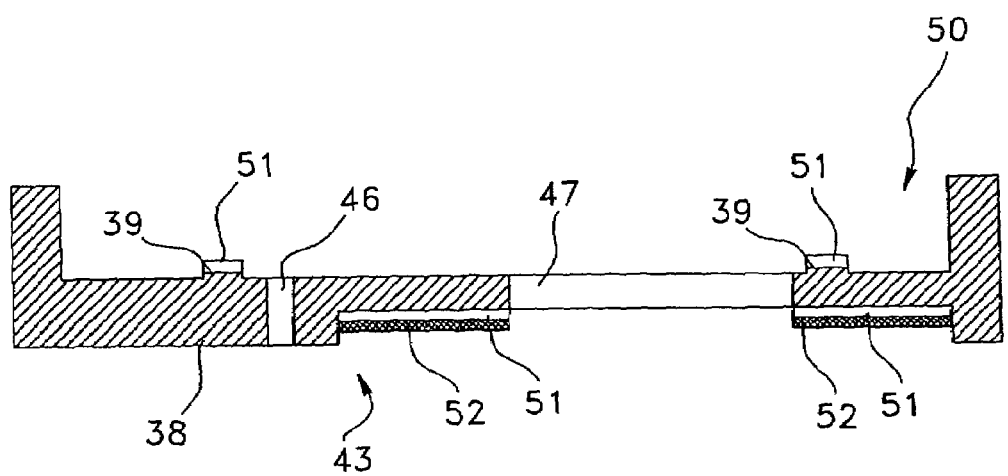

FIG. 14D shows deposition of a solder alloy layer 52 on the bonding pads 51 in the recess 43. This solder alloy layer 52 can be made out of a reflowed solder preform, can be plated, evaporated, sputtered or screen-printed. The solder alloy layer 52 will serve for soldering of the package window (not shown) to the miniature frame substrate 38 via the solderable bonding pads 51.

Figure 14E:
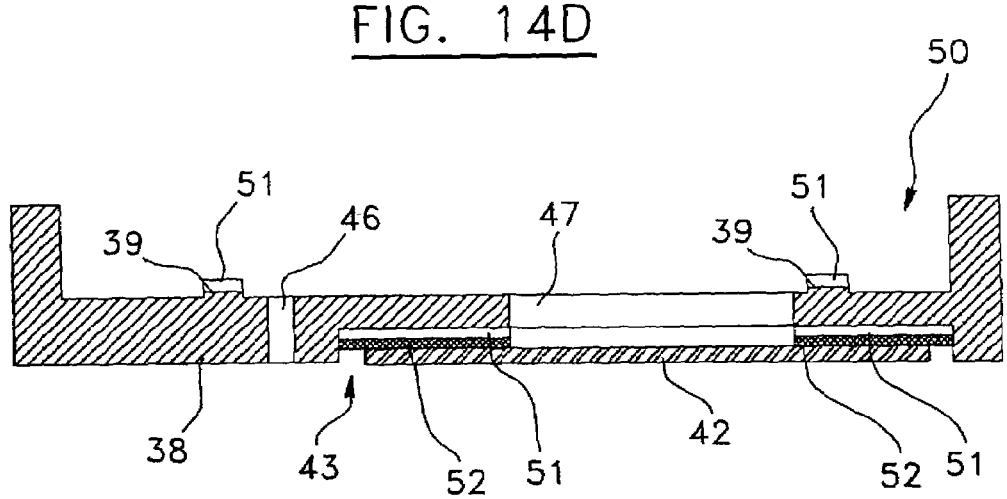

FIG. 14E shows soldering of the package window 42 to the miniature frame substrate 38 making use of the solder alloy layer 52 and the solderable bonding pads 51.

Figure 14F:
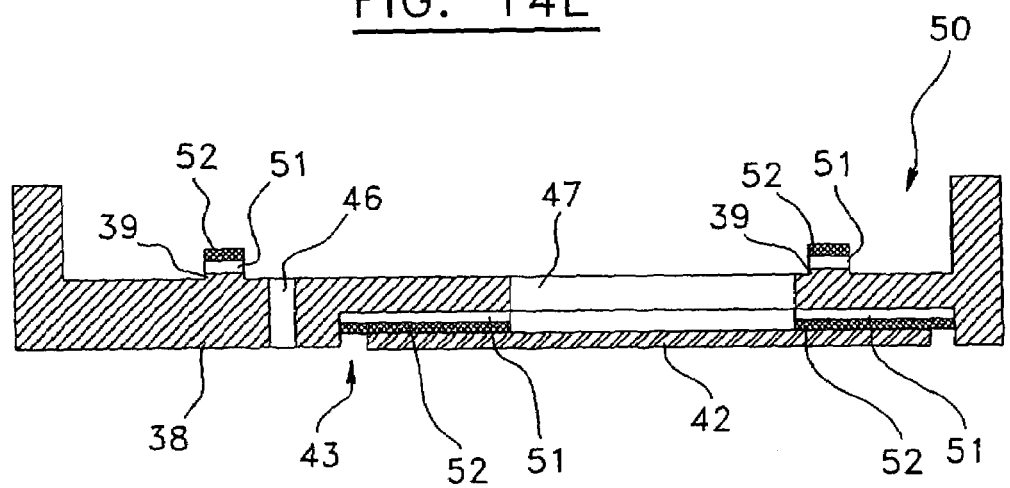

FIG. 14F shows deposition of a solder alloy layer 52 on the solderable bonding pads 51 placed on the spacer 39 of the miniature frame substrate 38. The material of the solder alloy layer 52 placed on the spacer 39 is selected to have a lower melting temperature than the melting temperature of the solder alloy layer 52 for soldering the window 42.

Figure 15A:
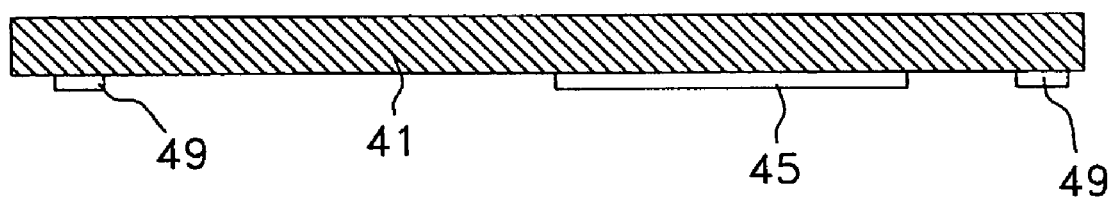

FIG. 15A shows the semiconductor microdevice die 41 equipped with an microdevice 45 (active part) and metallic bonding pads 49.

Figure 15B:
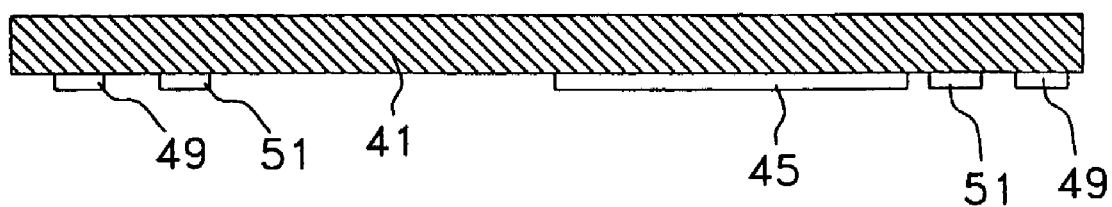

FIG. 15B shows deposition and patterning of metallic solderable bonding pads 51. These pads 51 can be produced by the same techniques as the techniques used for manufacturing of the solderable bonding pads 51 of the miniature frame substrate 38 shown in FIG. 14. The bonding pads 51 of the microdevice die 41 will serve for soldering of the microdevice die 41 to the miniature frame substrate 38 shown in FIG. 14.

Figure 16A:
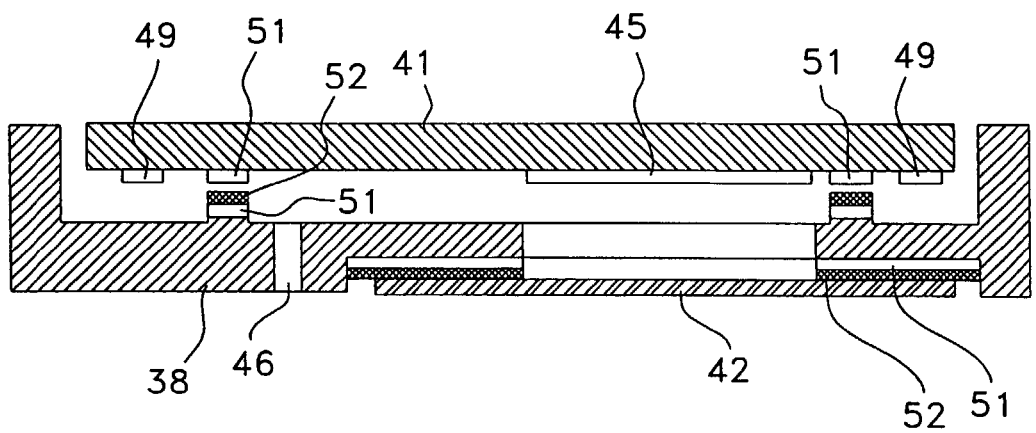

FIG. 16A shows the microdevice die 41 brought to a close contact and aligned with the miniature frame substrate 38. In particular, the solderable bonding pads 51 of the microdevice die 41 are aligned with the bonding pads 51 and the solder alloy layer 52 of the miniature frame substrate 38.

Figure 16B:
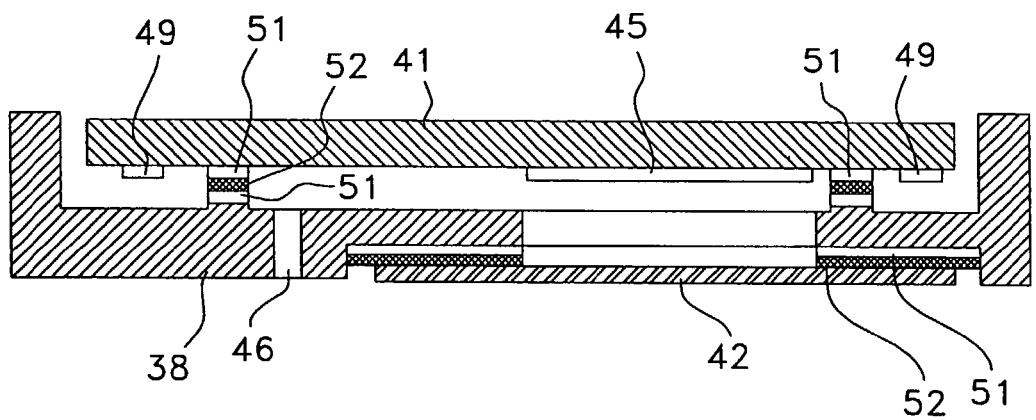

FIG. 16B shows hermetic soldering of the microdevice die 41 to the miniature frame substrate 38 using the solder alloy layer 52. The surface tension of the molten solder alloy layer 52 precisely aligns the soldered parts 41 and 38. A miniature chamber 48 is now formed between the soldered parts 41 and 38.

Figure 16C:
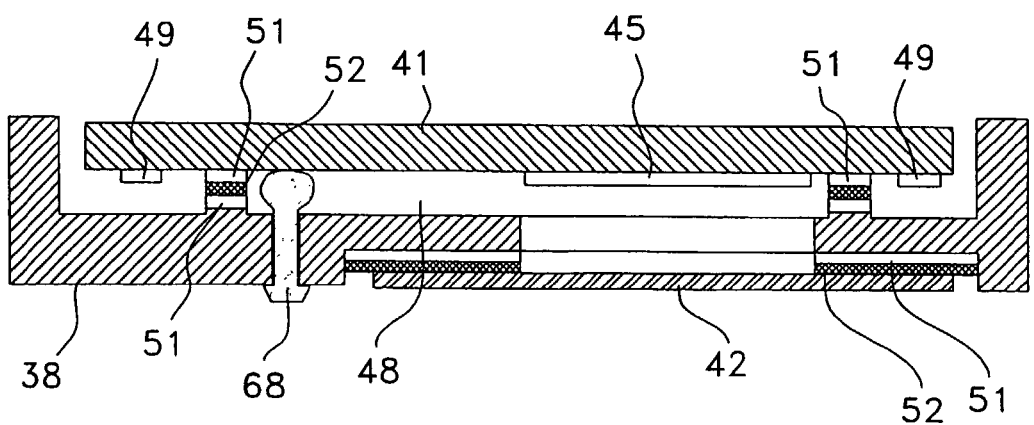

FIG. 16C shows hermetic plugging of the pump-out channel 46 with a plug 68. Before placing of the plug 68, the miniature chamber 48 is evacuated by vacuum pumping combined with a thermal outgasing of the inner walls of the chamber 48. The plug 68 is typically placed by vacuum evaporation of a suitable metallic or dielectric material. It is also possible to eliminate the plugging operation all together and to perform the soldering of the microdevice die 41 to the miniature frame substrate 38 in a vacuum environment. In this case, there is no requirement for a pump-out channel 46.

The miniature hermetic scheme according to the present invention offers the following advantages:

Potential for either individual die or multiple die (several dies in a single substrate) packaging;

Potential for low-cost and high-quality packaging;

Very small size comparable with the size of the microdevice dies;

Large-scale manufacturing of the ceramic frames (or trays) by pressing and sintering of the ceramic material and smaller scale manufacturing by precise machining of the ceramic material;

Potential for multiple window materials even in the multiple die packaging scheme;

Part joining operation combined or separated from the pump-out and plugging operations;

Flexibility in geometrical form;

Relaxed-precision sawing conditions;
Integrated electrical contact means replacing precise wire bonding; and
Reliability, hermetisity and self-alignment properties of solder bonding.

Although preferred embodiments of the present invention have been described in detail herein and illustrated in the accompanying drawings, it is to be understood that the invention is not limited to these precise embodiments and that various changes and modifications may be effected therein without departing from the scope or spirit of the present invention.

What is claimed is:

1. A process for making a miniature microdevice package, comprising steps of:
   (a) shaping a spacer in a miniature frame substrate made of a material selected from the group consisting of: ceramic, metal and a combination of ceramic and metal;
   (b) providing a semiconductor microdevice die having a microdevice substrate, a semiconductor microdevice integrated on the microdevice substrate, bonding pads integrated on the microdevice substrate, and electrical conductors integrated in the microdevice substrate for electrically connecting the bonding pads with the microdevice; and
   (c) mounting the microdevice die on the spacer to form a chamber, the microdevice being located within the chamber, the bonding pads being located outside of the chamber.

2. A process according to claim 1, further comprising steps of:
   (d) shaping the miniature frame substrate to form a channel for pumping air out of the chamber;
   (e) pumping air out of the chamber through the channel to produce a vacuum within the chamber; and
   (f) after step (e), hermetically sealing the channel.

3. A process according to claim 2, wherein the shaping of step (d) is performed during step (a).

4. A process according to claim 2, wherein the shaping of step (a) further comprises a step of shaping a recess in the miniature frame substrate for receiving the microdevice die.

5. A process according to claim 2, wherein the shaping of step (a) further comprises a step of shaping an opening for the chamber through the miniature frame substrate, the process further comprises, before step (e), a step of soldering a window on the miniature frame substrate for blocking the opening and allowing radiation inside the chamber.

6. A process according to claim 5, wherein the shaping of step (a) further comprises a step of shaping a recess in the miniature frame substrate for receiving the window.

7. A process for making miniature microdevice package, comprising steps of:
   (a) shaping spacers in a miniature frame substrate made of a material selected from the group consisting of: ceramic, metal and a combination of ceramic and metal;
   (b) providing semiconductor microdevice dies each having a microdevice substrate, a semiconductor microdevice integrated on the microdevice substrate, bonding pads integrated on the microdevice substrate, and electrical conductors integrated in the microdevice substrate for electrically connecting the bonding pads with the microdevice;
   (c) mounting the microdevice dies respectively on the spacers to form chambers, the microdevices being respectively located within the chambers, the bonding pads being located outside of the chambers; and
   (d) sawing the miniature frame substrate to obtain the miniature microdevice packages.

8. A process according to claim 7, further comprising steps of:
   (e) shaping the miniature frame substrate to form channels for pumping air out of the chambers;
   (f) pumping air out of the chambers through the channels to produce a vacuum within the chambers; and
   (g) after step (f), hermetically sealing the channels.

9. A process for making miniature microdevice packages, comprising steps of:
   (a) shaping spacers in a miniature frame substrate made of a material selected from the group consisting of: ceramic, metal and a combination of ceramic and metal;
   (b) providing semiconductor microdevice dies having a common microdevice substrate, each of the microdevice dies having a semiconductor microdevice integrated on the common microdevice substrate, bonding pads integrated on the common microdevice substrate, and electrical conductors integrated in the common microdevice substrate for electrically connecting the bonding pads with the microdevice;
   (c) mounting the common microdevice substrate with the microdevice dies respectively on the spacers to form chambers, the microdevices being respectively located within the chambers, the bonding pads being located outside of the chambers; and
   (d) sawing the miniature frame substrate with the mounted common microdevice substrate to obtain the miniature microdevice packages.

10. A process according to claim 9, further comprising steps of:
    (e) shaping the miniature frame substrate to form channels for pumping air out of the chambers;
    (f) pumping air out of the chambers through the channels to produce a vacuum within the chambers; and
    (g) after step (f), hermetically sealing the channels.

* * * * *